United States Patent
Sato et al.

(10) Patent No.: US 11,338,317 B2
(45) Date of Patent: May 24, 2022

(54) ELECTRONIC COMPONENT MANUFACTURING APPARATUS

(71) Applicant: Creative Coatings Co., Ltd., Tokyo (JP)

(72) Inventors: Eiji Sato, Tokyo (JP); Hitoshi Sakamoto, Nagaoka (JP)

(73) Assignee: Creative Coatings Co., Ltd., Tokyo (JP)

( * ) Notice: Subject to any disclaimer, the term of this patent is extended or adjusted under 35 U.S.C. 154(b) by 84 days.

(21) Appl. No.: 16/738,374

(22) Filed: Jan. 9, 2020

(65) Prior Publication Data
US 2020/0147639 A1    May 14, 2020

Related U.S. Application Data

(63) Continuation of application No. PCT/JP2019/027369, filed on Jul. 10, 2019.

(30) Foreign Application Priority Data

Jul. 10, 2018  (JP) .............................. JP2018-130961
Sep. 10, 2018  (JP) .............................. JP2018-168952

(51) Int. Cl.
*B05D 1/18*    (2006.01)
*B05C 13/02*    (2006.01)
(Continued)

(52) U.S. Cl.
CPC .................. *B05D 1/18* (2013.01); *B05C 3/09* (2013.01); *B05C 13/02* (2013.01); *H01C 17/28* (2013.01);
(Continued)

(58) Field of Classification Search
None
See application file for complete search history.

(56) References Cited

U.S. PATENT DOCUMENTS

| 5,383,997 A | 1/1995 | Minowa et al. |
| 7,673,382 B2 * | 3/2010 | Onodera .............. H01G 13/006 29/619 |

(Continued)

FOREIGN PATENT DOCUMENTS

| JP | S6345813 A | 2/1988 |
| JP | H05182879 A | 10/1997 |

(Continued)

*Primary Examiner* — Jethro M. Pence
(74) *Attorney, Agent, or Firm* — Nolan Heimann LLP; David L. Hoffman

(57) ABSTRACT

An electronic component manufacturing apparatus has a holding member for holding an electronic component body, a surface plate, a moving unit that causes the holding member and the surface plate to relatively move, and a control unit that controls the moving unit. The control unit causes the moving unit to simultaneously perform a distance changing movement for changing, by shortening or extending, the distance between an end face of each electronic component body and a surface of the surface plate, and a position changing movement for changing a two-dimensional position where the end face of the electronic component body is projected on the surface of the surface plate in such a manner that the direction in which the two-dimensional position moves in parallel with the surface of the surface plate successively varies (for example, along a circular path).

20 Claims, 13 Drawing Sheets

(51) Int. Cl.
*H01C 17/28* (2006.01)
*H01G 13/00* (2013.01)
*H01G 2/06* (2006.01)
*H01G 4/005* (2006.01)
*H05K 1/18* (2006.01)
*B05C 3/09* (2006.01)

(52) U.S. Cl.
CPC ............... *H01G 2/06* (2013.01); *H01G 4/005* (2013.01); *H01G 13/006* (2013.01); *H05K 1/185* (2013.01)

(56) References Cited

U.S. PATENT DOCUMENTS

2012/0128865 A1* 5/2012 Gu .......................... H01G 4/30
  427/58
2020/0016624 A1   1/2020 Sato et al.

FOREIGN PATENT DOCUMENTS

| JP | H04291712 A | 11/1997 |
| JP | 2002237403 A | 8/2002 |
| JP | 2016100459 A | 5/2016 |
| WO | WO2018070093 A1 | 4/2018 |

* cited by examiner

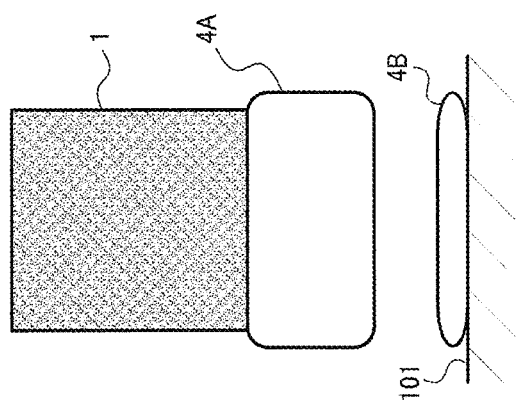
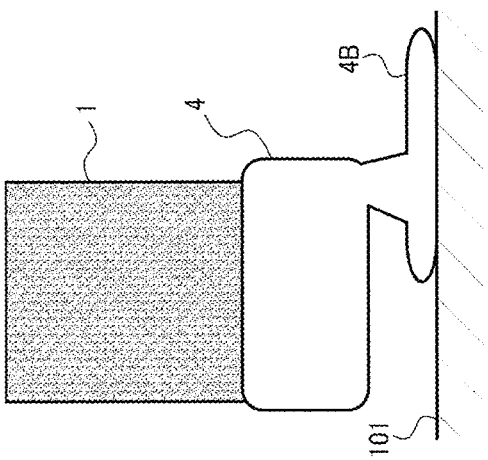
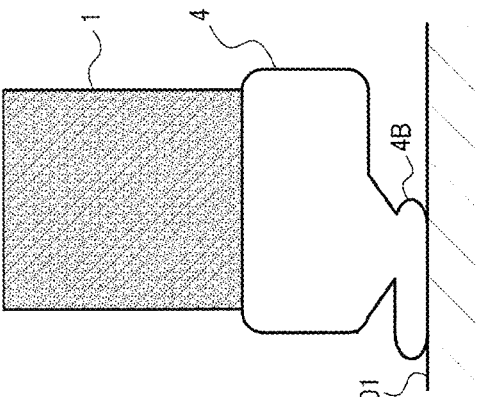
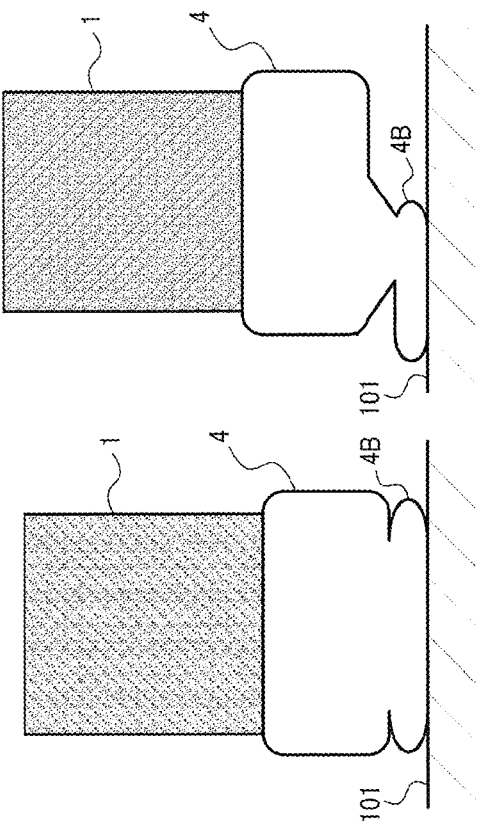

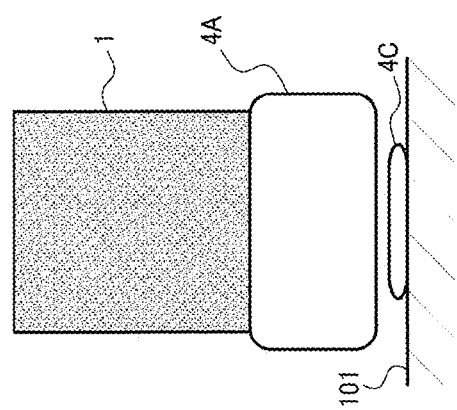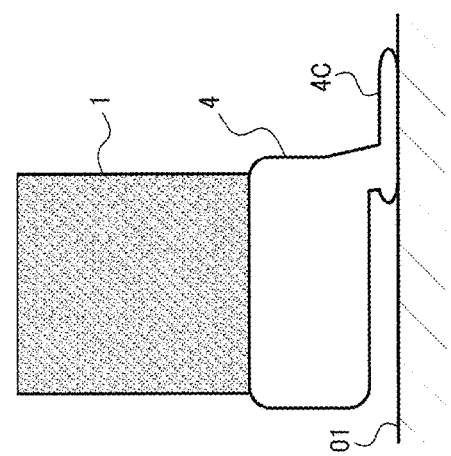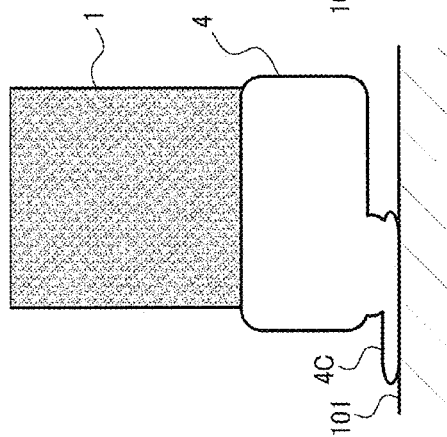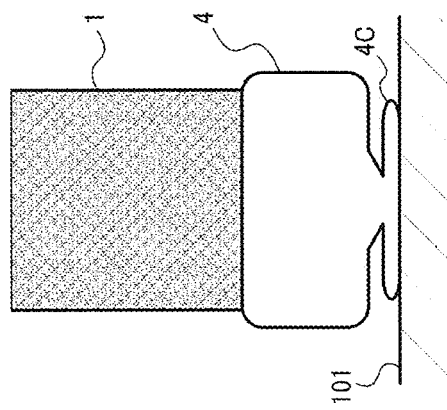

FIG. 13

| BLOTTING PROCESS / CHIP | COMPARATIVE EXAMPLE 1 | COMPARATIVE EXAMPLE 2 | IMPROVED BLOTTING PROCESS |
|---|---|---|---|
| ELECTRONIC COMPONENT BODY 1b (REFERENCE CHIP) | TOP FILM THICKNESS : 30 μm | TOP FILM THICKNESS : 22 μm | TOP FILM THICKNESS : 12 μm |
| ELECTRONIC COMPONENT BODY 1a (CHIP 20 μm LONGER THAN REFERENCE CHIP) | TOP FILM THICKNESS : 22 μm | TOP FILM THICKNESS : 15 μm | TOP FILM THICKNESS : 10 μm |
| RESULT | DIFFERENCE : 8 μm ADHESION IS THICK IF CHIP IS SHORT | DIFFERENCE : 7 μm ALMOST UNIFORM EXCEPT SOME VARIATION | DIFFERENCE : 2 μm VARIATION DUE TO SIZE DIFFERENCE IS REDUCED |

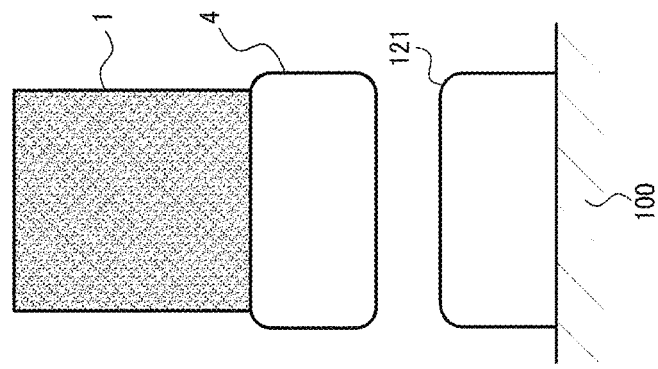
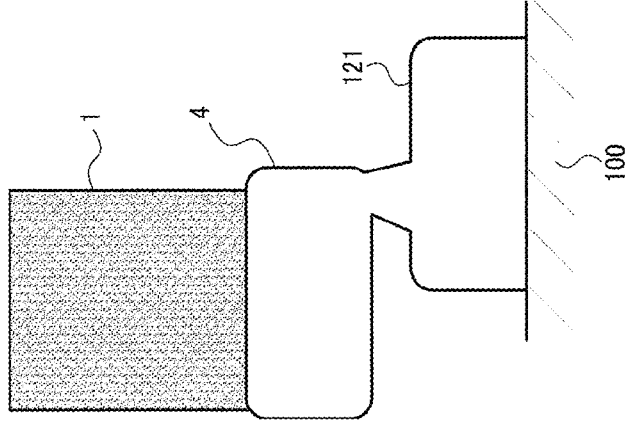
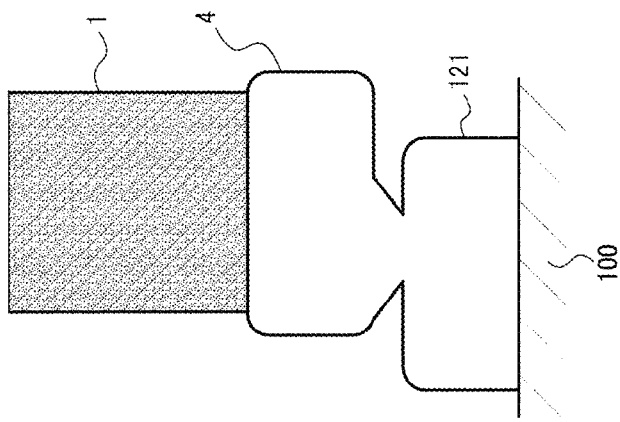
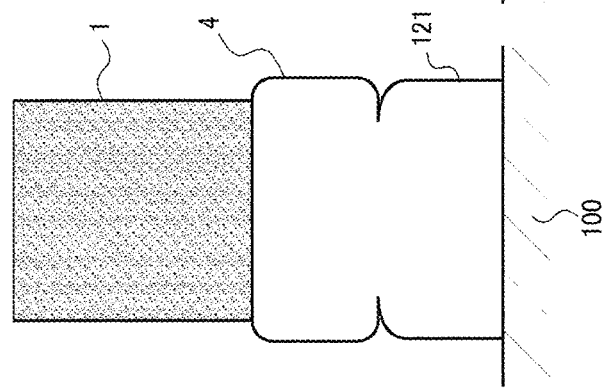

ELECTRONIC COMPONENT MANUFACTURING APPARATUS

CROSS REFERENCE TO RELATED APPLICATION

This application is a continuation of International Patent Application No. PCT/JP2019/027369, having an international filing date of Jul. 10, 2019, which designated the United States, the entirety of which is incorporated herein by reference. Japanese Patent Application No. 2018-168952 and Japanese Patent Application No. 2018-130961 filed on Sep. 10, 2018 and Jul. 10, 2018, respectively are also incorporated herein by reference in its entirety.

BACKGROUND

The present disclosure relates to an electronic component manufacturing apparatus.

One of the present inventors have proposed an apparatus and method for forming an external electrode on an electronic component body, such as a laminated ceramic capacitor, an inductor, or a thermistor, by dip coating a conductive paste layer on an end face of this electronic component body (JP-A-2002-237403). The film thickness of the conductive paste layer as it is dip-coated cannot be made uniform. Therefore, it is conventionally proposed to pull up an electronic component body dip-coated with the conductive paste from a conductive paste film layer formed on a surface plate and then bring a saggy portion of the conductive paste formed on an end portion of the electronic component body into contact with the surface plate from which the conductive paste film layer has been removed (JP-A-63-45813). This process is referred to as a blotting process because extra conductive paste on the electronic component body is wiped off by the surface plate.

It is expected that the uniformity of the conductive paste layer formed at the end portion of the electronic component body can be enhanced by improving the blotting process. However, it has been found that the conductive paste layer formed at the end portion of the electronic component body can be made uniform by using the blotting process in combination with the dip coating, or without necessitating the blotting process.

BRIEF DESCRIPTION OF THE DRAWINGS

FIGS. 6A to 6D are diagrams illustrating operations in the blotting process illustrated in FIG. 5A;

FIGS. 8A to 8D are diagrams illustrating operations of a blotting process according to a comparable example in which a position changing movement is not included;

FIG. 13 is a diagram illustrating data obtained by evaluating the improved blotting processes and two comparable examples;

FIGS. 16A to 16D are diagrams illustrating a coating process that can be performed by the manufacturing apparatus illustrated in FIGS. 3 and 4.

DESCRIPTION OF EXEMPLARY EMBODIMENTS

Figure 1:
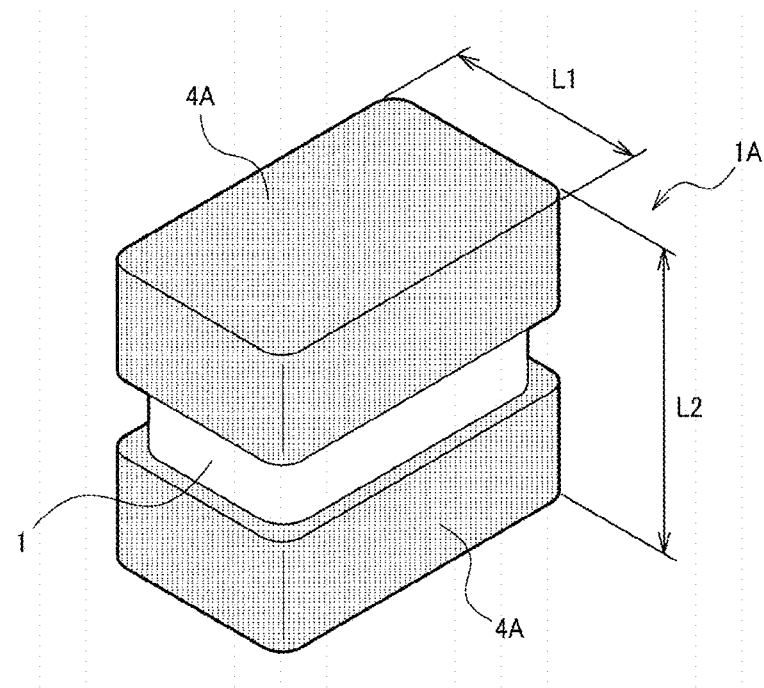
FIG. 1 is a diagram illustrating an example of an electronic component that can be manufactured by an electronic component manufacturing method and apparatus according to one of some embodiments.

The following disclosure provides many different embodiments, or examples, for implementing different features of the provided subject matter. These are, of course, merely examples and are not intended to be limiting. In addition, the disclosure may repeat reference numerals and/or letters in the various examples. This repetition is for the purpose of simplicity and clarity and does not in itself dictate a relationship between the various embodiments and/or configurations discussed. Further, when a first element is described as being "connected" or "coupled" to a second element, such description includes embodiments in which the first and second elements are directly connected or coupled to each other, and also includes embodiments in which the first and second elements are indirectly connected or coupled to each other with one or more other intervening elements in between. Further, when the first element is described as "moving" relative to the second element, such description includes embodiments in which at least one of the first element and the second element moves relative to the other.

The present disclosure intends to provide an electronic component manufacturing apparatus that improves processes other than the blotting process to make a conductive paste layer formed at an end portion of an electronic component body uniform in thickness or shape.

(1) According to one of some embodiments there is provided an electronic component manufacturing apparatus d comprising:

a holding member for holding an electronic component body;

a surface plate;

moving unit that moves the holding member and the surface plate relatively in a direction perpendicular to a surface of the surface plate as well as in a direction parallel to the surface of the surface plate; and control unit that controls the moving unit to bring an end face of the electronic component body held by the holding member into contact with the surface of the surface plate, and thereafter take the end face of the electronic component body away from the surface of the surface plate, the control unit causing the moving unit to simultaneously perform a distance changing movement for changing a distance between the end face of the electronic component body and the surface of the surface plate and a position changing movement for changing a two-dimensional position where the end face of the electronic component body is projected on the surface of the surface plate in such a manner that the movement direction of the two-dimensional position successively varies in a plane parallel to the surface of the surface plate.

According to the embodiment (1), during the distance changing movement for changing, by shortening or extending, the distance between the end face of the electronic component body and the surface of the surface plate, the position changing movement is simultaneously performed for changing in such a manner that the movement direction of the two-dimensional position of the electronic component body successively varies within the plane parallel to the surface of the surface plate. Thus, it is possible to attain a relative movement of the electronic component body that cannot be attained only by a conventional distance changing movement. Accordingly, the mounting posture of the electronic component body with respect to the holding member can be corrected, or smooth separation from a dip layer of conductive paste formed on the surface of the surface plate can be realized. Thus, the conductive paste layer formed at the end portion of the electronic component body can be made uniform in thickness or shape.

(2) In the embodiment (1), the electronic component manufacturing apparatus, wherein the control unit shortens the distance between the end face of the electronic component body and the surface of the surface plate during the distance changing movement, and, at least, at the time of overdrive after bringing the end face of the electronic component body held by the holding member into contact with the surface of the surface plate, can simultaneously perform the distance changing movement and the position changing movement, thereby correcting the posture of the electronic component body held by the holding member. According to this configuration, before the coating process, and during the prepress in which the end face of the electronic component body is in contact with the surface of the surface plate, an external force that successively changes the movement direction of the two-dimensional position of the electronic component body within the plane parallel to the surface of the surface plate can be applied to the electronic component body. Thus, the mounting posture of the electronic component body with respect to the holding member can be corrected.

(3) In the embodiment (2), the electronic component manufacturing apparatus, wherein the holding member can be a jig including an elastic jig body and a hole formed through the jig body and into which the electronic component body is inserted. In this case, the amount of protrusion (head protrusion amount) by which the electronic component body protrudes from the jig body can be made uniform, and the posture of the electronic component body can be corrected. Further, even when the electronic component body is inclined with respect to the center line of the hole, such an inclination can be eliminated by promoting the insertion of the electronic component body, and the posture of the electronic component body can be corrected.

(4) In the embodiment (2), the electronic component manufacturing apparatus, wherein the holding member can include a base material and an adhesive layer formed on the base material, and the adhesive layer is bonded to a second end face opposite to the end face of the electronic component body. In this case, the second end face of the electronic component body is entirely directed so as to be bonded to the adhesive layer, and the posture of the electronic component body attached inclinedly to the adhesive layer can be corrected.

(5) In the embodiment (1), the electronic component manufacturing apparatus, wherein the surface of the surface plate is a dip layer of conductive paste, and the control unit simultaneously performs the distance changing movement and the position changing movement after an end portion including the end face of the electronic component body is dipped in the dip layer, and can extend the distance between the end face of the electronic component body and the surface of the surface plate during the distance changing movement. According to this configuration, when the electronic component body is pulled away from the surface plate side after the end portion of the electronic component body is dipped in the dip layer, it is possible to perform the substantial blotting process for successively changing the movement direction of the two-dimensional position of the electronic component body within the plane parallel to the surface of the surface plate. Thus, in the coating process, the conductive paste layer formed at an end portion of the electronic component body can be made uniform. Further, since the blotting process is performed during the coating process, it is also possible to omit the blotting process subsequent to the coating process.

(6) In the embodiments (1) to (5), the electronic component manufacturing apparatus, wherein the holding member can hold a plurality of electronic component bodies including the electronic component body.

(7) in the embodiments (1) to (6), the electronic component manufacturing apparatus, wherein in the position changing movement, a movement locus of the two-dimensional position draws a loop, and the distance changing movement and the position changing movement can cause the electronic component body to move spirally with respect to the surface of the surface plate. Accordingly, the position changing process can be efficiently performed while minimizing a required area of the surface plate.

Figure 2:
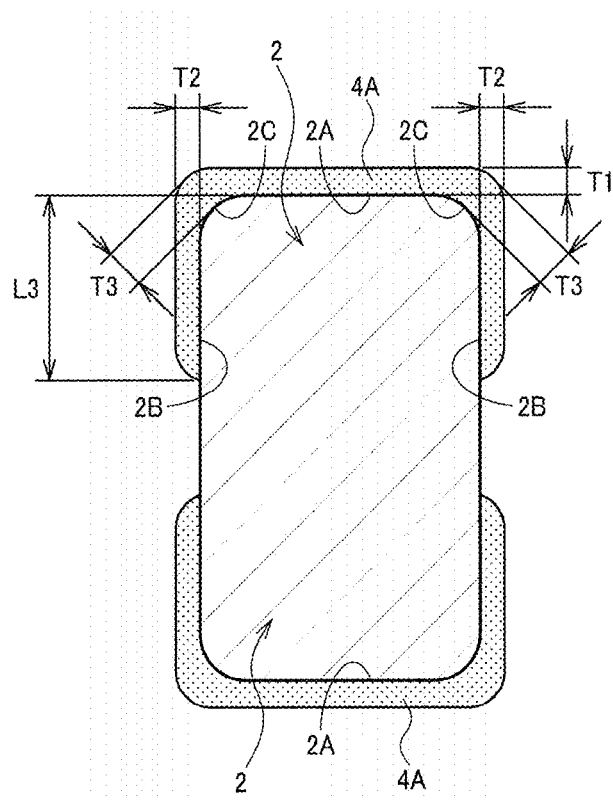
FIG. 2 is a cross-sectional view of the electronic component illustrated in FIG. 1.

Exemplary embodiments are described below. Note that the following exemplary embodiments do not in any way limit the scope of the content defined by the claims laid out herein. Note also that all of the elements described in the present embodiment should not necessarily be taken as essential elements 1. Electronic Component FIG. 1 illustrates an electronic component 1A manufactured according to a manufacturing method according to an embodiment of the disclosure. FIG. 2 illustrates a cross section of a conductive layer 4A formed on an electronic component body 1. Here, the electronic component 1A to which the disclosure is applied is not particularly limited in size, but it is desired that the electronic component 1A is microminiaturized according to downsizing. As illustrated in FIG. 1, the microminiaturized electronic component 1A is rectangular (square or oblong) in cross section. When L1 represents the maximum length of one side of the rectangular cross section and L2 represents the length in a direction orthogonal to the rectangular cross section, L1 is 500 µm or less and L2 is 1000 µm or less, Preferably, L1 is 300 µm or less and L2 is 600 µm or less, and more preferably, L1 is 200 µm or less and L2 is 400 µm or less. Further preferably, L1 is 125 µm or less and L2 is 250 µm or less. The term "rectangle" as used herein includes not only the one in which a corner where two sides intersect is strictly 90° but also substantially rectangular shape in which a corner curved or chamfered. It is needless to say that the disclosure can also be applied to any other electronic component 1A that has a cross section of non-rectangular.

As illustrated in FIG. 2, at each end portion of the electronic component body 1, an electrode 4A being a conductive paste layer is formed on the electronic component 1A. Each end portion 2 of the electronic component body 1 includes an end face 2A, an end face 2B, and a corner portion 2C connecting the end face 2A and the end face 2B. Substantially uniform thickness T1 of the electrode 4A formed on the end face 2A and substantially uniform thickness T2 of the electrode 4A formed on the end face 2B can be substantially in a relationship of T1=T2. In addition, thickness T3 of the electrode 4A formed on the corner portion 2C can satisfy a relationship T3≥T1 or T3≥T2. Further, L3 represents the electrode length of the electrode 4A formed on the end face 2B extending from the end face 2A. A plurality of electronic components 1A, when manufactured according to the manufacturing method according to an embodiment of the disclosure, is required to have uniformity in dimensions (T1 to T3 and L3) of the electrode 4A.

2. Electronic Component Manufacturing Apparatus

Figure 3:
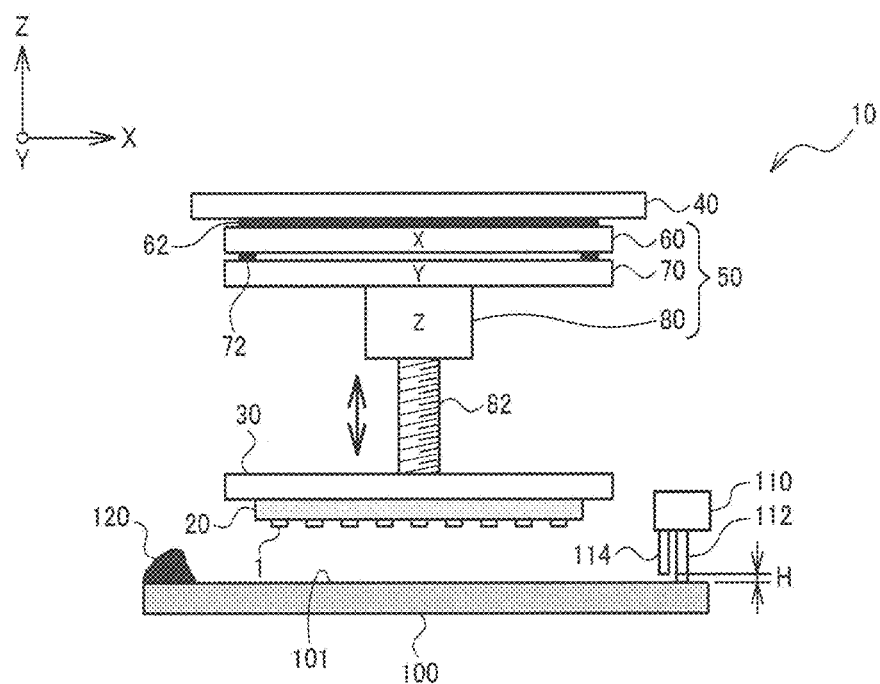
FIG. 3 is a diagram illustrating an electronic component manufacturing apparatus according to one of some embodiments.
Figure 4:
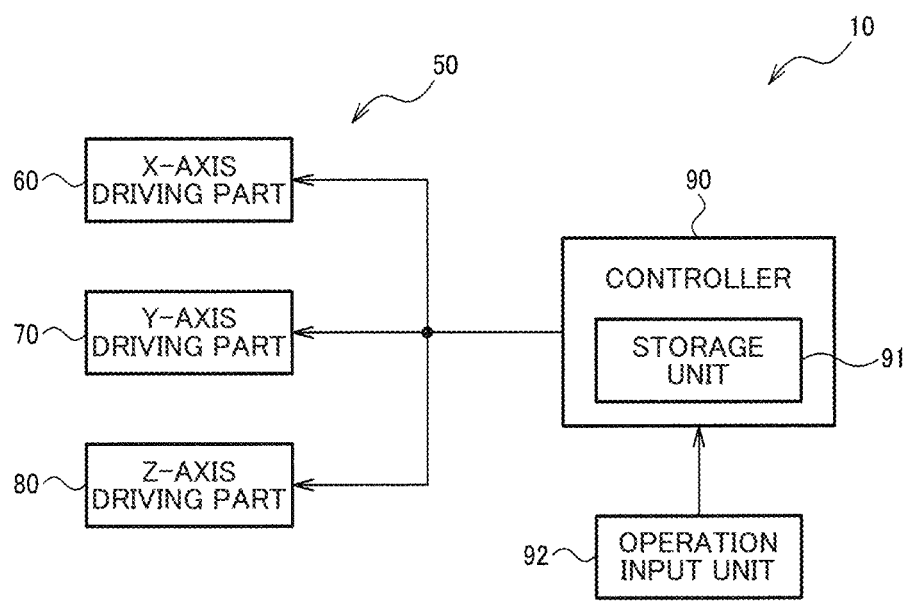
FIG. 4 is a block diagram illustrating the manufacturing apparatus illustrated in FIG. 3.

FIG. 3 illustrates a manufacturing apparatus 10 that can be used to implement the present embodiment. FIG. 4 is a block diagram illustrating a control system. The manufacturing apparatus 10 has a carrier plate (jig) 20 which is holding member for holding the electronic component bodies 1, a transfer mechanism 50, and a surface plate 100. In FIG. 3, X, Y, and Z represent three orthogonal axial directions.

The carrier plate (jig) 20, which hangs and holds the electronic component bodies 1, elastically holds the electronic component bodies 1 so as to be movable in a direction perpendicular to a surface 101 of the surface plate 100. The carrier plate 20 can be configured, for example, by an adhesive tape that is elastically deformable in the Z direction. The carrier plate 20 is detachably supported by a jig fixing plate 30. A base 40 is fixed above the jig fixing plate 30, and the surface plate 100 is disposed below the jig fixing plate 30.

The surface plate 100 is provided with a squeegee unit 110 including a squeegee 112 and a blade 114. The squeegee unit 110 is movable on the surface plate 100. By moving the blade 114, the squeegee unit 110 can form a dip layer of a conductive paste 120 having height H on the surface 101 of the surface plate 100. By moving the squeegee 112, the squeegee unit 110 can scrape the dip layer of the conductive paste 120 from the surface 101 of the surface plate 100.

The base 40 is provided with the transfer mechanism 50 for moving the jig fixing plate 30. In the present embodiment, the transfer mechanism 50 can include an X-axis driving part 60, a Y-axis driving part 70, and a Z-axis driving part 80. The transfer mechanism 50 is not particularly limited if it can cause a relative movement between the jig fixing plate 30 and the surface plate 100 in the X-, Y-, and Z-axis directions. That is, the transfer mechanism 50 may be configured to move the surface plate 100. Alternatively, the transfer mechanism 50 may be configured to include not only the transfer mechanism for moving the jig fixing plate 30 but also another transfer mechanism for moving the surface plate 100. Alternatively, the transfer mechanism 50 may be configured such that at least one of the X-axis driving part 60, the Y-axis driving part 70, and the Z-axis driving part 80 causes the jig fixing plate 30 to move and the rest causes the surface plate 100 to move.

The X-axis driving part 60 can be configured by an X table movable in the X-axis direction with respect to the base 40 along an X-axis guide 62. The Y-axis driving part 70 can be configured by a Y table movable in the Y-axis direction with respect to the X-axis driving part 60 along a Y-axis guide 72. The Z-axis driving part 80 is fixed to, for example, the Y-axis driving part 70, and can move a Z shaft 82 in the Z-axis direction. The jig fixing plate 30 is fixed to the Z shaft 82. FIG. 3 does not include any illustration of X-, Y-, and Z-axis driving sources, such as motors, and driving force transmission mechanisms thereof.

Thus, the transfer mechanism 50 enables the jig fixing plate 30, the carrier plate 20, and the electronic component bodies 1 to move relative to the surface plate 100 not only in the Z-axis direction but also along an X-Y plane parallel to the surface of the surface plate 100.

As illustrated in FIG. 4, the manufacturing apparatus 10 has a controller 90 that controls the X-axis driving part 60, the Y-axis driving part 70, and the Z-axis driving part 80. The controller 90 is connected to an operation input unit 92 such as a keyboard or the like. The controller 90 includes a storage unit 91. The storage unit 91 stores operational information input via the operation input unit 92, programs registered in advance, and the like. The controller 90 controls the X-axis driving part 60, the Y-axis driving part 70, and the Z-axis driving part 80 according to data and programs stored in the storage unit 91. By using the X-axis driving part 60 and the Y-axis driving part 70, the controller 90 can cause the jig fixing plate 30 to move along, for example, a circular path in a plane parallel to the surface plate 100 (position changing). Further, while the jig fixing plate 30 is moved along the circular path by the X-axis driving part 60 and the Y-axis driving part 70, the controller 90 can drive the Z-axis driving part 80 to raise or lower the jig fixing plate 30 (distance changing).

3. Electronic Component Manufacturing Method

The manufacturing apparatus 10 according to the present embodiment performs a prepress process, a coating process, and a subsequent blotting process. The prepress process is a process of bringing the end face 2A of each electronic component body 1 of the electronic component bodies 1 held by the carrier plate 20 into contact with the surface plate 100 before the coating process, as described below. The coating process is a process of bringing the end portion 2 including the end face 2A of each of the electronic component bodies 1 held by the carrier plate 20 into contact with the dip layer of conductive paste formed on the surface 101 of the surface plate 100 and coating the conductive paste to the end portion 2 of each of the electronic component bodies 1. The blotting process is a process of bringing the conductive paste coated to each the end portion 2 of the electronic component bodies 1 held by the carrier plate 20 into contact with the surface 101 of the surface plate 100 and transferring a surplus conductive paste to the surface plate 100.

3.1. Improved First Blotting Process

Figure 5A:
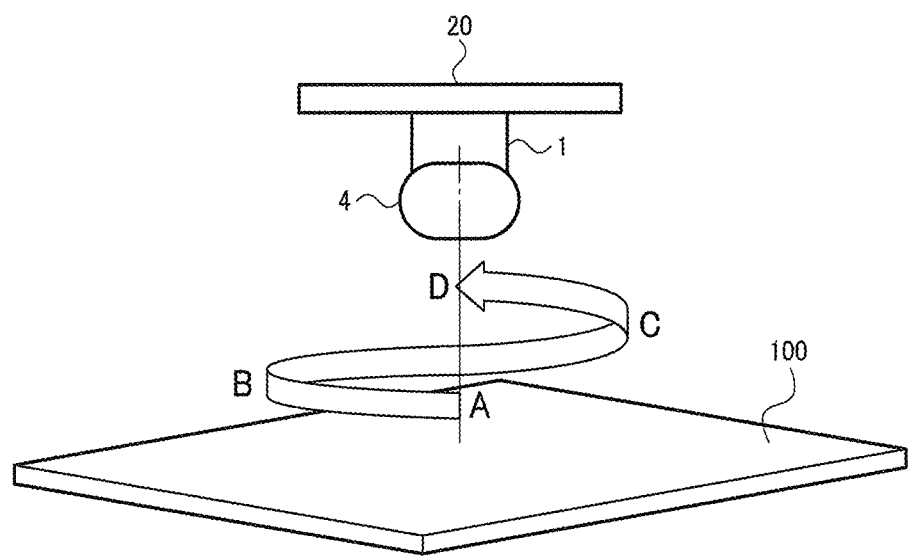
FIGS. 5A and 5B are diagrams illustrating improved blotting processes that can be performed by the manufacturing apparatus illustrated in FIGS. 3 and 4.

FIG. 5A schematically illustrates an improved first blotting process. FIG. 5A illustrates an example of relative movement of the surface plate 100 and the electronic component bodies 1 (although only one is illustrated in FIG. 5) held by the carrier plate 20 in the blotting process. In this blotting process, to implement a distance changing process for extending the distance between end face 2A of the electronic component body 1 and the surface 101 of the surface plate 100 and a position changing process for changing a two-dimensional position where the end face 2A of the electronic component body 1 is projected on the surface 101 of the surface plate 100 in such a manner that the movement direction of the two-dimensional position successively varies in a plane parallel to the surface 101 of the surface plate 100, the controller 90 controls the transfer mechanism 50 to cause the carrier plate 20 and the surface plate 100 to move relatively. That is, a projection of the end face 2A on the surface 101 moves its projected two-dimensional position on the surface 101.

FIG. 5A illustrates a spiral motion that is an example of the distance changing process and the position changing process. That is, the controller 90 simultaneously controls the X-axis driving part 60, the Y-axis driving part 70, and the Z-axis driving part 80 to raise the electronic component body 1 away from the surface plate 100 while causing the electronic component body 1 to turn in a loop orbit, such as a circle or an ellipse. FIG. 5A illustrates positions A to D during ascent of the electronic component body 1. In FIG. 5A, similar in FIGS. 5B and 12, the conductive paste layer formed at the end portion 2 of the electronic component body 1 is indicated by reference numeral 4 if the blotting process is not completed yet and by reference numeral 4A after the completion of the blotting process. Further, the conductive paste transferred to the surface plate 100 is denoted by reference numeral 4B.

FIGS. 6A to 6D illustrate blotting operations at respective positions A to D illustrated in FIG. 5A. In FIG. 6A, of the conductive paste layer 4 formed at the end portion of the electronic component body 1, the extra conductive paste 4B having been brought into contact with the surface plate 100 is transferred to the surface plate 100 while it is dragged toward the downstream side in a horizontal movement direction of the electronic component body 1, as illustrated in FIGS. 6B and 6C. At this time, while the position changing process is performed, the relative movement direction of the electronic component body 1 with respect to the surface plate 100 successively varies in the plane parallel to the surface plate 100. Although the conductive paste layer 4 of the electronic component body 1 is dragged by the conductive paste 4B transferred to the surface plate 100 or the surface plate 100, the conductive paste layer 4 is easily scraped off since the direction of dragging successively varies. In addition, the problem such that the extra conductive paste stays downstream in the movement direction does not occur as in the case of linear movement in which the relative movement direction does not successively vary. Therefore, the film thickness of the conductive paste layer 4A is not locally thickened. Further, when the end face 2A of the electronic component body 1 is rectangular, the extra conductive paste is easily collected at the corner portion 2C, and it becomes easy to secure the film thickness of the conductive paste at the corner portion 2C.

In the distance changing process according to the first blotting process, the electronic component body 1 relatively moves in a direction away from the surface plate 100 during the blotting process. Therefore, the amount of the conductive paste transferred to the surface plate 100 is reduced, and a relatively thick film thickness of the conductive paste of the electronic component body 1 can be secured.

3.2. Improved Second Blotting Process

Figure 5B:
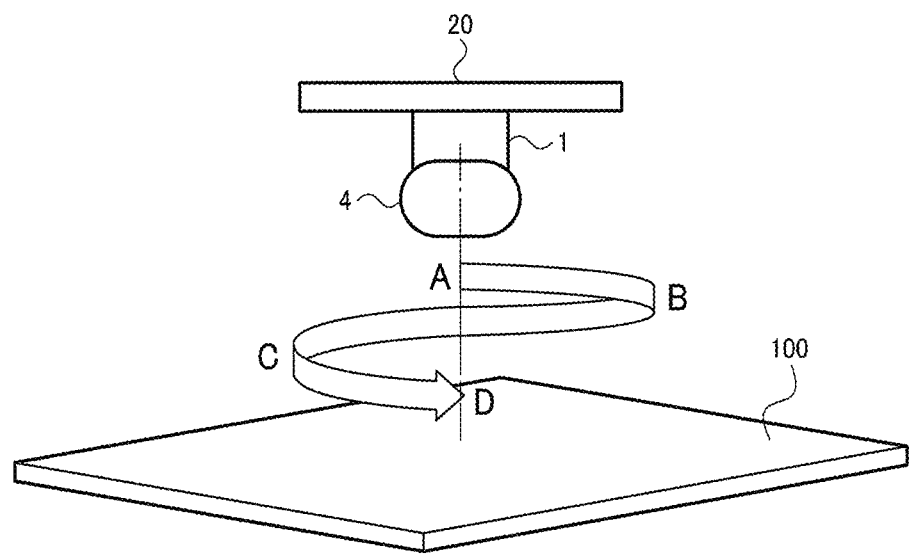

FIG. 5B schematically illustrates a blotting process according to a second embodiment. FIG. 5B is different from FIG. 5A only in that the distance change direction is the downward direction. That is, the controller 90 simultaneously controls the X-axis driving part 60, the Y-axis driving part 70, and the Z-axis driving part 80 to lower the electronic component body 1 in such a way as to approach the surface plate 100 while spirally turning. FIG. 5B illustrates respective positions A to D during descent of the electronic component body 1.

FIGS. 7A to 7D illustrate blotting operations at respective positions A to D illustrated in FIG. 5B. Even in the second embodiment, the position changing process is performed in the same manner as in the first blotting process. In a distance changing process according to the second embodiment, the electronic component body 1 relatively moves in a direction approaching the surface plate 100 during the blotting process. Therefore, the amount of the conductive paste transferred to the surface plate 100 is increased, and a relatively thin film thickness of the conductive paste of the electronic component body 1 can be secured.

According to the first and second blotting processes described above, implementation of the distance changing process can adjust the amount of the conductive paste to be brought into contact with the surface plate 100 during the blotting process. Therefore, depending on the film thickness of the conductive paste to be secured for the electronic component body 1, the film thickness can be selectively adjusted by shortening (the first blotting process) or extending (the second blotting process) the distance in the distance changing process. This blotting process is such that the extra conductive paste is scraped off during the blotting process including the distance and position changing processes, and the conductive paste does not draw threads after the blotting process. Accordingly, since no trace of threads is left, the surface of the conductive paste layer 4A of the electronic component body 1 becomes flat.

In the position changing processes in the first and second blotting processes, not only the loop locus such as a circular path, an elliptic path, or the like but also starting and end points of the position changing process in the plane parallel to the surface plate 100 do not necessarily coincide if the direction of the relative movement between the electronic component body 1 and the surface plate 100 successively varies in the plane parallel to the surface plate 100.

Figure 7A:
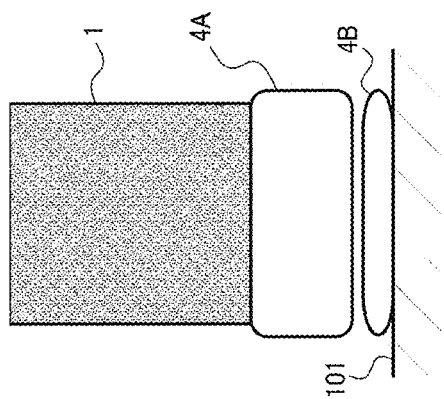
FIGS. 7A to 7D are diagrams illustrating operations in the blotting process illustrated in FIG. 5B.
Figure 7B:
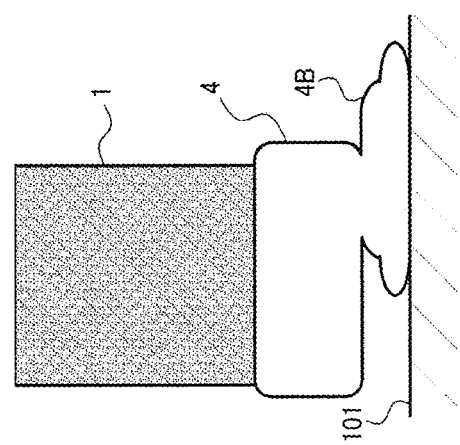
Figure 7C:
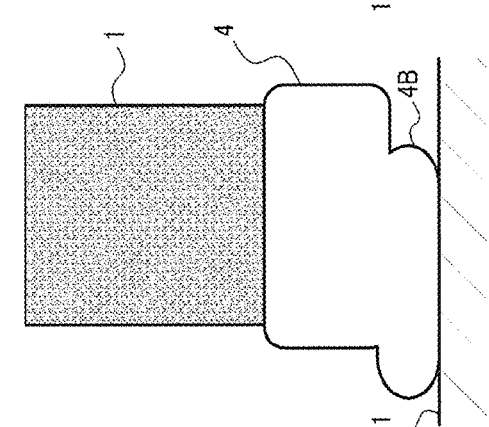
Figure 7D:
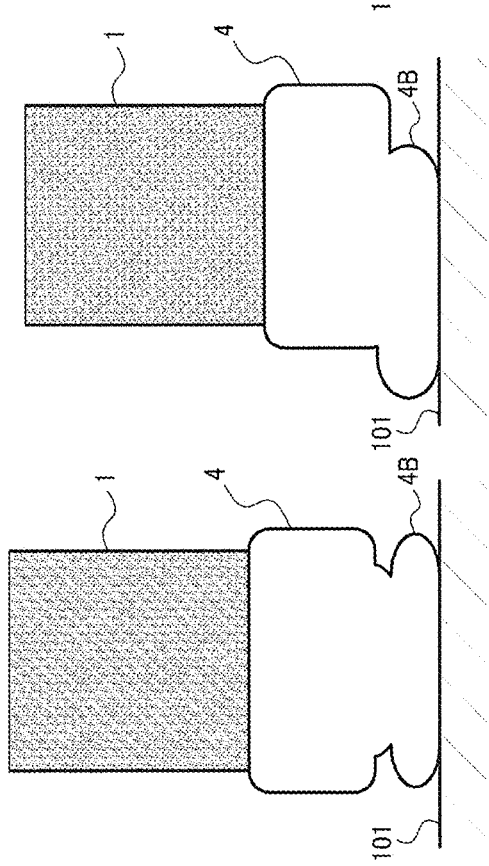

In addition, the blotting processes of the first and second blotting processes illustrated in FIGS. 5A and 5B may be implemented in combination. First, each process according to the second blotting process illustrated in FIGS. 7A, 7B, and 7C is implemented. Before the state illustrated in FIG. 7D is obtained, the distance shortening process is stopped. Subsequently, each process according to the first blotting process illustrated in FIGS. 6B, 6C, and 6D is implemented to complete the blotting process. At this time, turn direction in the process illustrated in FIGS. 7A, 7B, and 7C and the turn direction in the process illustrated in FIGS. 6B, 6C, and 6D may be the same or opposite. When the blot process of FIGS. 5A and 5B is performed in combination, the thickness of the conductive paste layer 4A is different from the thickness of the conductive paste layer 4A obtained in the blot process of FIG. 5A or FIG. 5B. Accordingly, the freedom degree of the thickness of the conductive paste layer 4A spreads.

FIG. 8 illustrates a blotting process in a comparative example, in which extra conductive paste 4C is transferred to the surface plate 100 by implementing only the position changing process without implementing the distance changing process, while the electronic component body 1 and the surface plate 100 are kept constant in position in the vertical direction. In the blotting process illustrated in FIG. 8, the operations illustrated in FIGS. 6 and 7 cannot be performed. However, for example, if the conductive paste 4 applied to the electronic component body 1 leaves sharp protrusions, the blotting process illustrated in FIG. 8 is suitable for leveling the protrusions and shaping the surface of the conductive paste 4 into a flat shape.

Figure 9:
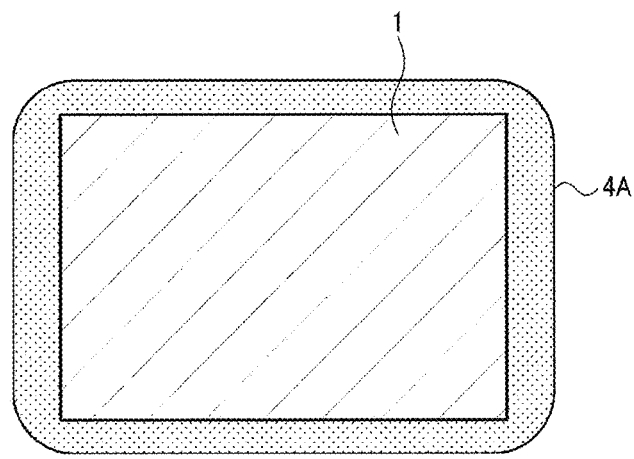
FIG. 9 is a cross-sectional view of an electronic component body manufactured by performing the blotting process illustrated in FIG. 5A or FIG. 5B.

FIG. 9 illustrates a cross-sectional view of the electronic component body 1 obtained by implementing the blotting processes according to the first and second blotting processes. As illustrated in FIG. 9, the conductive paste layer 4A formed on the electronic component body 1 has a uniform film thickness on four end faces 2B continuous from the end face 2A, and the necessary film thickness of the conductive paste layer 4A can be secured at the corner portion 2C.

3.3. Third Blotting Process

A third blotting process uses the blotting process according to the second embodiment to simultaneously perform blotting process on the electronic component bodies 1.

3.3.1. Coating Process

Figure 10:
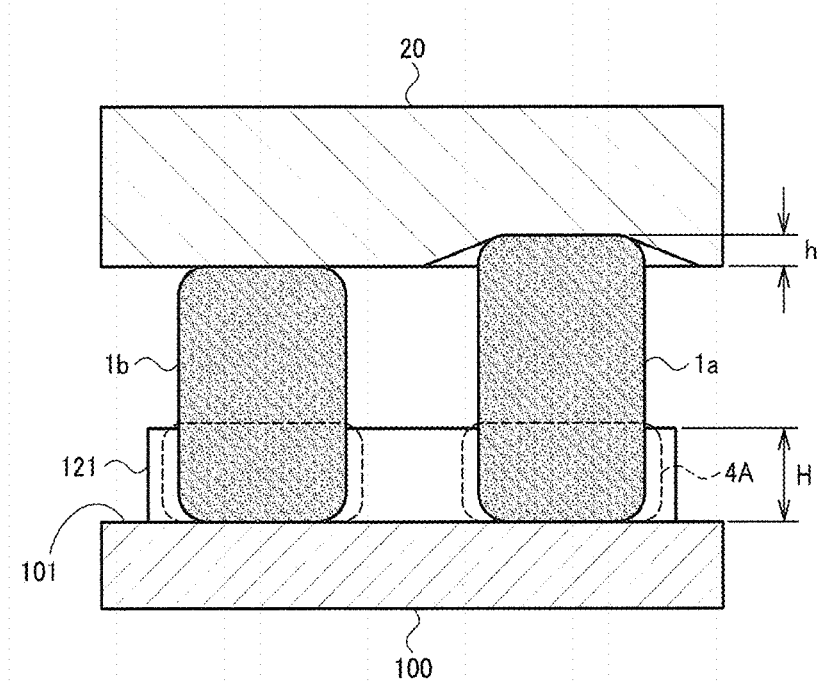
FIG. 10 is a diagram illustrating a coating process that can be performed by the manufacturing apparatus illustrated in FIGS. 3 and 4.

FIG. 10 illustrates a coating process. In the coating process, as illustrated in FIG. 10, a dip layer 121 of the conductive paste 120 (FIG. 3) is formed in advance on the surface 101 of the surface plate 100. Subsequently, the controller 90 controls the transfer mechanism 50 to relatively move the carrier plate 20 and the surface plate 100 in the Z direction, to bring the end face 2A of each of the electronic component bodies 1 into contact with the surface 101 of the surface plate 100. In the example illustrated in FIG. 10, a right electronic component body 1a is longer by h than a left electronic component body 1b. The variation h of the length of the electronic component body 1 is, for example, several tens of µm. Even in this case, the movement in the Z direction is continued after the end face 2A of the electronic component body 1a on the right side of FIG. 10 is brought into contact with the surface 101 of the surface plate 100. Therefore, the electronic component body 1a on the right side of FIG. 10 retracts upward due to elastic deformation of the carrier plate 20, while maintaining contact with the surface 101 of the surface plate 100. Then, the relative movement in the Z direction is continued until the end face 2A of the electronic component body 1b on the left side of FIG. 10 contacts the surface 101 of the surface plate 100. At this time, the carrier plate 20 and the surface plate 100 may be relatively moved in the Z direction by an over stroke amount by which the electronic component body 1b on the left side of FIG. 10 retracts upward due to the elastic deformation of the carrier plate 20 while maintaining the contact with the surface 101 of the surface plate 100. By bring the end face 2A of each of the plurality of electronic component bodies 1a and 1b into contact with the surface 101 of the surface plate 100 as illustrated in FIG. 10, the length of the coating formed on the end portion 2 of each of the plurality of electronic component bodies 1a and 1b coincides with the height H of the dip layer 121. As a result, the lengths L3 (FIG. 2) of the electrodes 4A formed on the end portion 2 of each of the electronic component bodies 1 are equalized, and the electrodes 4A become uniform in shape.

Figure 11:
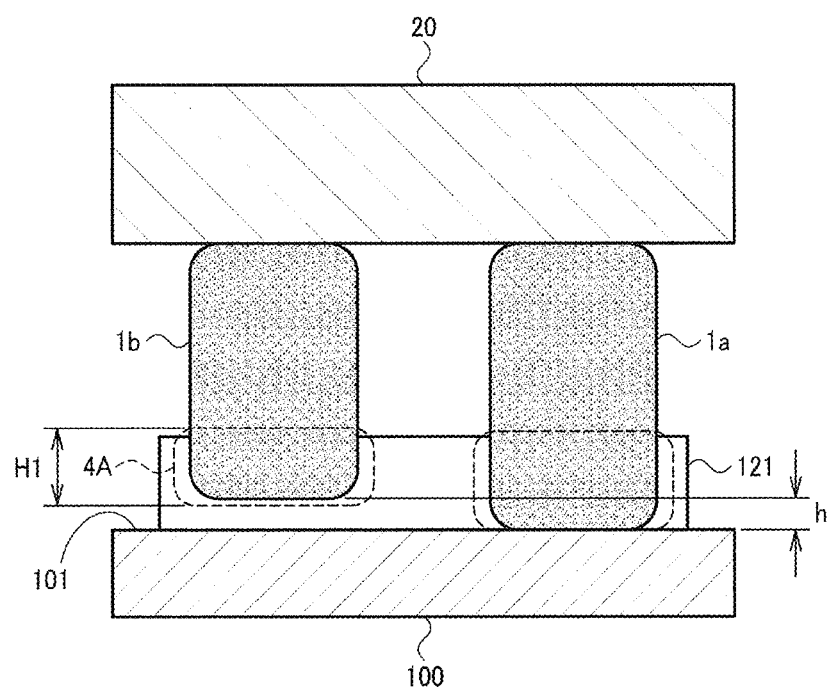
FIG. 11 is a diagram illustrating a coating process according to a comparable example.

FIG. 11 illustrates a coating process in a comparative example. Unlike the carrier plate 20 illustrated in FIG. 10, a carrier plate 21 illustrated in FIG. 11 does not have a function of holding the electronic component body 1 so as to be elastically movable in the Z direction. In this case, the relative movement in the Z direction is stopped when the electronic component body 1a on the right side of FIG. 11 contacts the surface 101 of the surface plate 100. Therefore, the electronic component body 1b on the left of FIG. 11 is not in contact with the surface 101 of the surface plate 100, and the coating length of the electrode 4A formed on the end portion 2 becomes H1 (<H). Therefore, coating lengths of the electrodes 4A formed on the end portions 2 between the electronic component bodies 1 become irregular. According to the embodiments of the disclosure, it is possible to prevent the variation in coating length of the electrode 4A illustrated in FIG. 11.

3.3.2. Blotting Process

Figure 12:
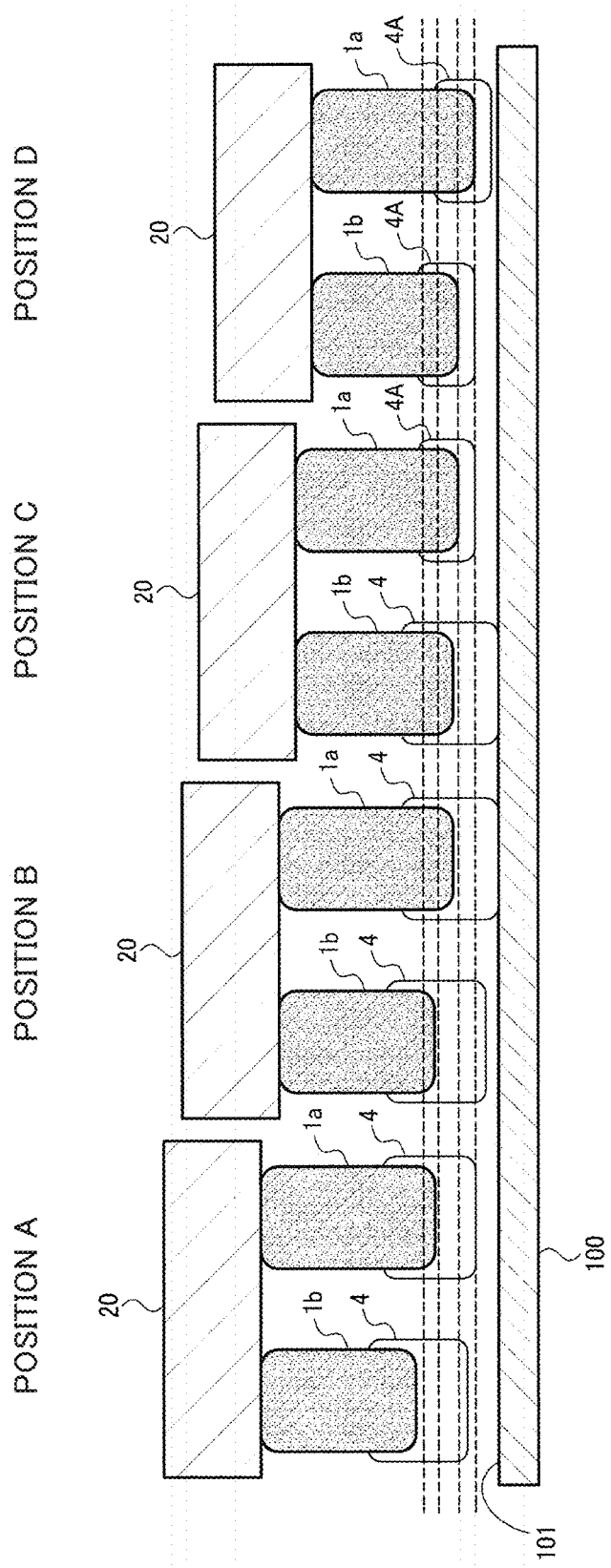
FIG. 12 is a diagram illustrating the state of conductive paste at each descent position during the blotting process illustrated in FIG. 5B.

The second blotting process illustrated in FIG. 5B is employed as the blotting process after the coating process shown in FIG. 10. FIG. 12 illustrates the state of two electronic component bodies 1a and 1b different in length, during descent, at respective positions A to D illustrated in FIG. 5B, in FIG. 12, like in FIG. 10, the right electronic component body 1a is longer than the left electronic component body 1b.

At the position A in FIG. 5B, the conductive paste layers 4 of the electronic component bodies 1a and 1b do not reach the surface 101 of the surface plate 100, as illustrated in FIG. 12. At the position B in FIG. 5B where the height changing process has been performed, the conductive paste layer 4 of the electronic component body 1a reaches the surface 101 of the surface plate 100, as illustrated in FIG. 12. Subsequently, as the electronic component body 1a descends spirally, the conductive paste layer 4 contacts the surface 101 of the surface plate 100 while changing its position. As a result, the extra conductive paste is scraped off to the surface plate 100, and the conductive paste layer 4 remaining on the electronic component body 1a is shaped while forming threads with the conductive paste transferred to the surface plate 100. At the position C in FIG. 5B, the formation of threads by the electronic component body 1a terminates and the conductive paste layer 4A is left as a completion form of the blotting process, as illustrated in FIG. 12.

On the other hand, at the position C in FIG. 5B where the height changing process is further performed, as illustrated in FIG. 12, the conductive paste layer 4 of the electronic component body 1b reaches the surface 101 of the surface plate 100. Subsequently, as the electronic component body 1b descends spirally, the conductive paste layer 4 contacts the surface 101 of the surface plate 100 while successively changing its position. As a result, the extra conductive paste is scraped off to the surface plate 100, and the conductive paste layer 4 remaining on the electronic component body 1b is shaped while forming threads with the conductive paste transferred to the surface plate 100. At the position D in FIG. 5B, the formation of threads by the electronic component body 1b terminates and the conductive paste layer 4A is left as a completion form of the blotting process, as illustrated in in FIG. 12.

As described above, the implementation of the blotting process according to the present embodiment can equalize the thicknesses of the conductive paste layers 4A formed on end faces of the plurality of electronic component bodies 1a and 1b even when the plurality of electronic component bodies 1a and 1b vary in position of the end face 2A. As a result, the conductive paste layers 4A formed on the end portions 2 of the plurality of electronic component bodies 1a and 1b are made uniform in shape. Further, in this blotting process, the height changing process and the position changing process are simultaneously performed. By doing this, while the plurality of electronic component bodies 1a and 1b relatively move closer to the surface plate 100, the plurality of electronic component bodies 1a and 1b are relatively moved with the component in a direction parallel to the surface plate 100. Further, causing the plurality of electronic component bodies 1a and 1b to move relatively and spirally so as to approach the surface 101 of the surface plate 100 can efficiently implement the position changing process while minimizing the required area of the surface plate 100.

For example, only one of the coating process illustrated in FIG. 10 and the blotting process illustrated in FIGS. 5B and 12 may be implemented. Through the coating process illustrated in FIG. 10, the length L3 (FIG. 2) of the coating formed on the end portion 2 of each of the plurality of electronic component bodies 1a and 1b coincides with the height H of the dip layer 121. Further, by implementing the blotting process illustrated in FIGS. 5B and 12, the thicknesses T1 (FIG. 2) of the conductive paste layers 4A formed on the end faces of the plurality of electronic component bodies 1a and 1b are made uniform. This is because the electrode 4A formed on the end portion 2 of each of the electronic component bodies 1 is independently made uniform in shape.

FIG. 13 illustrates representative evaluation data obtained by implementing the blotting processes in comparative examples 1 and 2 and the present embodiment for the electronic component bodies 1a and 1b different in length. The comparative example 1 uses the blotting process disclosed in JP-A-63-45813, The comparative example 2 uses the blotting process in which the electronic component body 1 is moved linearly with respect to the surface plate 100. Regarding the blotting processes in the comparative examples 1 and 2, the difference of the conductive paste layer 4a in TOP film thickness (film thickness T1 in FIG. 2) occurring due to the difference in length between the electronic component bodies 1a and 1b was as large as 7 to 8 µm. On the other hand, in the improved blotting process, the difference in TOP film thickness of the conductive paste layer 4a was reduced to 2 µm. From this, the uniformization effect of the thickness T1 (FIG. 2) of the conductive paste layer 4A by the blotting process illustrated in FIGS. 5 and 12 is understood.

Further, the blotting process illustrated in FIGS. 5B and 12 may not necessarily use the carrier plate 20 used in the coating process illustrated in FIG. 10, because the blotting process does not require the elastic deformation of the carrier plate 20. Further, in the coating process illustrated in FIG. 10 and in the blotting process illustrated in FIGS. 5B and 12, it is unnecessary to use the same surface plate 100. A first surface plate may be used in the coating process illustrated in FIG. 10, and a second surface plate may be used in the blotting process illustrated in FIGS. 5B and 12.

3.4. First Embodiment (Improved Prepress Process)

Hereinafter, an embodiment using the manufacturing apparatus 10 illustrated in FIGS. 3 and 4 to perform the prepress process before the coating process will be described. In addition, after the prepress process described below and after the coating process is performed, the above-described blotting process (comparable example 1, comparable example 2, or improved blotting process) is performed.

3.4.1. First Prepress Process

Figure 14A:
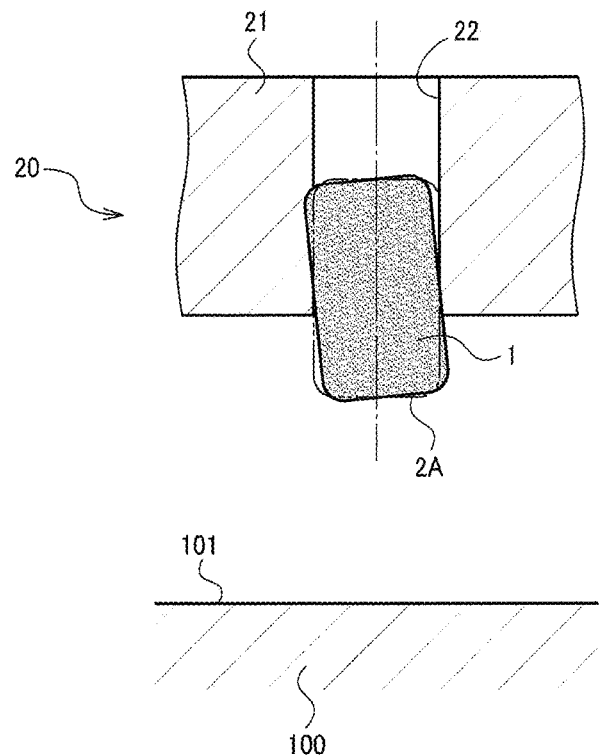
FIGS. 14A and 14B are diagrams illustrating a first prepress process that can be performed by the manufacturing apparatus illustrated in FIGS. 3 and 4.
Figure 14B:
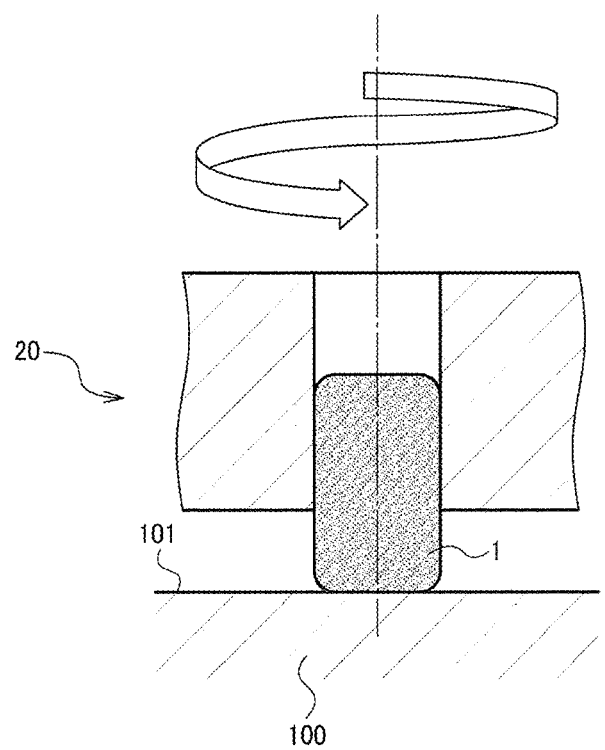

FIGS. 14A and 14B illustrate a first prepress process. As illustrated in FIG. 14A, the jig 20 holding the electronic component body 1 has a hole 22 formed in a jig body 21 made of an elastic body, such as silicon rubber. The electronic component body 1 is inserted and held in the hole 22.

The prepress process is performed, using the manufacturing apparatus 10 illustrated in FIGS. 3 and 4, by relatively moving the jig 20 holding the electronic component body 1 inserted in the hole 22 of the jig body 21 and the surface plate 100, in the prepress process, the end face 2A of the electronic component body 1 is brought into contact with the surface 101 of the surface plate 100. As a result, the amount of protrusion (head protrusion amount) of the electronic component body 1 protruding from the jig 20, that is the position of protrusion (head protrusion position) of the end face 2A of the electronic component body 1, can be corrected so as to be constant. If the amount of protrusion of the electronic component body 1 protruding from the jig 20 is different in the coating process, nonuniformity will occur in such a manner that the amount or shape of conductive paste to be coated to the end portion 2 of the electronic component body 1 is different. However, the nonuniformity is corrected by the prepress process.

Here, before the prepress process, the posture including the insertion length or orientation of the electronic component body 1 with respect to the hole 22 of the jig body 21 (perpendicularity with respect to the jig body 21) varies. This is because, at the time of insertion of the electronic component body 1, the posture of the electronic component body 1 varies with respect to the hole 22, and the elastic jig body 21 is deformed.

Conventionally, in the prepress process, the jig 20 is linearly moved downward with respect to the surface plate 100. According to this configuration, the electronic component body 1 will be pushed back at the time of overdrive after the end face 2A of the electronic component body 1 is brought into contact with the surface 101 of the surface plate 100. Thus, it is expected that the amount of protrusion (head protrusion amount) of the electronic component body 1 can be made uniform.

However, at the time of overdrive, the jig body 21 pushed by the electronic component body 1 may be elastically deformed. In this case, when the overdrive is released and the electronic component body 1 is pulled away from the surface plate 100, an adverse effect may arise in such a manner that only the jig body 21 is elastically restored and the amount of protrusion (head protrusion amount) of the electronic component body 1 is not changed.

In order to prevent this adverse effect, as illustrated in FIG. 14B, a distance shortening movement and a position changing movement are simultaneously performed in the same manner as in FIG. 5B. However, unlike FIG. 5B, the conductive paste layer 4 is not formed on the electronic component body 1 as illustrated in FIG. 14B. In addition, simultaneously performing the distance shortening movement and the position changing movement at least during the overdrive will be satisfactory, but the simultaneous execution of these movements may be performed before the overdrive.

According to this configuration, at the time of overdrive, the external force whose orientation varies successively within the plane parallel to the surface 101 of the surface plate 100 acts on the electronic component body 1. Therefore, even when the jig body 21 is elastically deformed, the insertion of the electronic component body 1 into the hole 22 of the jig body 21 is promoted. Thus, the amount of protrusion (head protrusion amount) of the electronic component body 1 can be made uniform, and the posture of the electronic component body 1 can be corrected. In addition, as illustrated in FIG. 14A, even when the electronic component body 1 is inclined with respect to the center line of the hole 22, such an inclination can be eliminated by promoting the insertion of the electronic component body 1, and the posture of the electronic component body 1 can be corrected.

3.4.1 Second Prepress Process

Figure 15A:
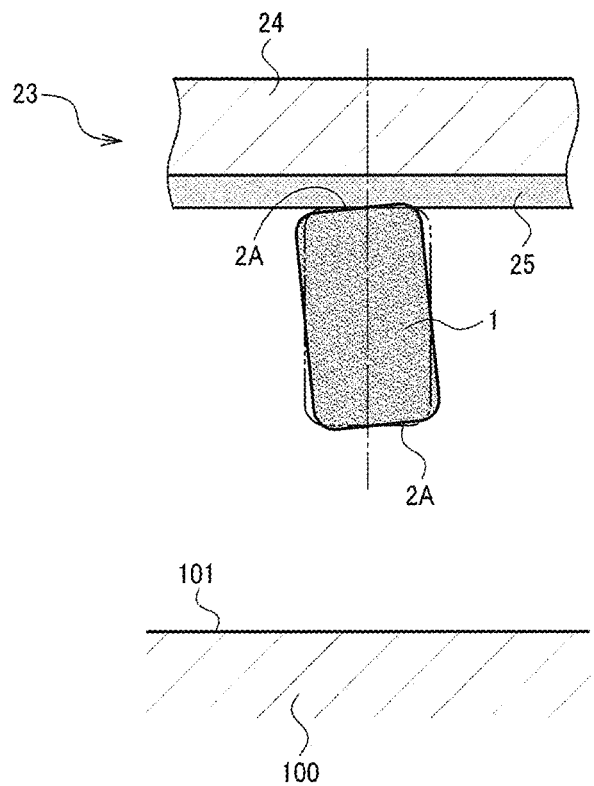
FIGS. 15A and 15B are diagrams illustrating a second prepress process that can be performed by the manufacturing apparatus illustrated in FIGS. 3 and 4.
Figure 15B:
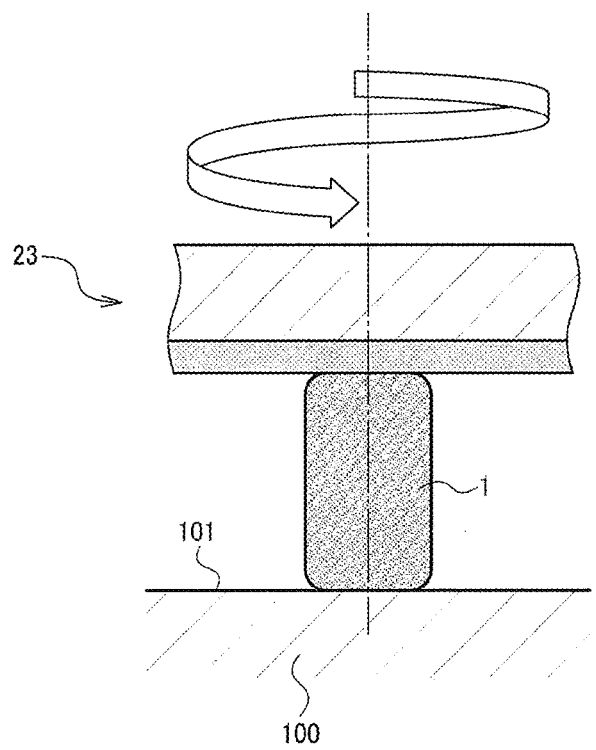

FIGS. 15A and 15B illustrate a second prepress process. As illustrated in FIG. 15A, the holding member 23 for holding the electronic component body 1 includes an adhesive layer 25 on one surface of a base material 24. The base material 24 may be a rigid body or a flexible member such as a tape. Of two end faces 2A and 2A of the electronic component body 1, one end face 2A is bonded to the adhesive layer 25, and a conductive paste is applied to an end portion including the other end face 2A. In this case, before the prepress process, the posture including the orientation of the electronic component body 1 with respect to the hole 22 of the jig body 21 (perpendicularity with respect to the base material 24) varies as illustrated in FIG. 15A. This variation in posture cannot be corrected by only linearly moving the holding member 23 downward with respect to the surface plate 100, like the conventional prepress process. This is because the inclined posture of the electronic component body 1 may be maintained while only a corner of the end face 2A of the inclined electronic component body 1 is in contact with the surface plate 100.

In order to prevent this adverse effect, as illustrated in FIG. 15B, the distance shortening movement and the position changing movement are simultaneously performed. Even in FIG. 15B, like FIG. 14B, simultaneously performing the distance shortening movement and the position changing movement at least during the overdrive will be satisfactory, but the simultaneous execution of these movements may be performed before the overdrive.

According to this configuration, at the time of overdrive, the external force whose orientation varies successively within the plane parallel to the surface 101 of the surface plate 100 acts on the electronic component body 1. Therefore, even when only a corner of the end face 2A of the inclined electronic component body 1 is in contact with the surface plate 100, the end face 2A of the electronic component body 1 is entirely directed so as to be bonded to the adhesive layer 25 by the successively changing external force. Thus, the posture of the electronic component body 1 can be corrected. When the base material 24 is a flexible member, a rigid body is disposed on the back surface of the base material 24 during the relative movement of the holding member 23, and the base material 24 can be prevented from being deformed.

3.5. Second Embodiment (Improved Coating Process)

Hereinafter, an embodiment using the manufacturing apparatus 10 illustrated in FIGS. 3 and 4 to perform the prepress process before the coating process will be described. In addition, it is preferable that the improved prepress process is performed before the coating process described below, and the prepress process and the coating process can be performed by using the manufacturing apparatus 10 illustrated in FIGS. 3 and 4. However, after the coating process, the above-described blotting process (comparable example 1, comparable example 2, or improved blotting process) may be performed, or the blotting process itself may be omitted. This is because the thickness or shape of the conductive paste layer formed on the end portion 2 of the electronic component body 1 can be made uniform by the improved coating process.

In the coating process, the surface of the surface plate 100 is the dip layer 121 of conductive paste. In order to dip the end portion 2 of the electronic component body 1 held by the jig 20 in the dip layer 121, it is only required to move the jig 20 and the surface plate 100 relatively in the Z direction in FIG. 3, like the related art. Subsequently, to separate the electronic component body 1 from the surface plate 100 side, a relative movement illustrated in FIGS. 16A to 16D is performed.

In FIGS. 16A to 16D, a distance extending movement and a position changing movement are simultaneously performed in the same manner as in FIG. 5A. FIG. 16A illustrates an initial state where the electronic component body 1 is separated from the surface plate 100. Subsequently, through the relative movement illustrated in FIGS. 16B and 16C, the conductive paste layer 4 formed at the end portion of the electronic component body 1 is completely separated from the dip layer 121 as illustrated in FIG. 16D. The relative movement illustrated in FIGS. 16A to 16D functions like the improved blotting process illustrated in FIGS. 6A to 6D. In other words, by performing the movement process illustrated in FIGS. 16A to 16D in the separation process after the dipping to the dip layer 121 in the coating process, the separation process becomes similar to the improved blotting process illustrated in FIGS. 6A to 6D. As a result, it becomes possible to omit the blotting process after the improved coating process.

Although only some embodiments of the present disclosure have been described in detail above, those skilled in the art will readily appreciate that many modifications are possible in the embodiments without materially departing from the novel teachings and advantages of this disclosure. Accordingly, all such modifications are intended to be included within scope of this disclosure.

What is claimed is:
1. An electronic component manufacturing apparatus comprising:
 a carrier plate that holds an electronic component body;
 a surface plate having a flat surface;
 a transfer mechanism that includes an X-axis driver, a Y-axis driver and a Z-axis driver that move the carrier plate and the surface plate relatively in a Z-direction which is a direction perpendicular to the flat surface of the surface plate as well as in both X and Y directions which are transverse to each other and which are in directions parallel to the flat surface of the surface plate; and a controller that controls the transfer mechanism to bring an end face of the electronic component body held by the carrier plate into contact with the flat surface of the surface plate, and thereafter take the end face of the electronic component body away from the flat surface of the surface plate, the controller causing the transfer mechanism to simultaneously perform a distance changing movement by way of the Z-axis driver for changing a distance between the end face of the electronic component body and the flat surface of the surface plate and a position changing movement by way of both of the X-axis driver and the Y-axis driver for changing a two-dimensional position where the end face of the electronic component body is projected on the flat surface of the surface plate in such a manner that the movement direction of the two-dimensional position successively varies on the flat surface of the surface plate in the X and Y directions.

2. The electronic component manufacturing apparatus according to claim 1, wherein the controller shortens the distance between the end face of the electronic component body and the flat surface of the surface plate during the distance changing movement, and, at least, at the time of overdrive after bringing the end face of the electronic component body held by the carrier plate into contact with the flat surface of the surface plate, simultaneously performs the distance changing movement and the position changing movement, thereby correcting the posture of the electronic component body held by the carrier plate.

3. The electronic component manufacturing apparatus according to claim 2, wherein the carrier plate is a jig including an elastic jig body and a hole formed through the jig, body and into which the electronic component body is inserted.

4. The electronic component manufacturing apparatus according to claim 2, wherein the carrier plate includes a base material and an adhesive layer formed on the base material, and the adhesive layer is bonded to another end face opposite to the end face of the electronic component body.

5. The electronic component manufacturing apparatus according to claim 1, wherein the flat surface of the surface plate is a dip layer of conductive paste, and the controller simultaneously performs the distance changing movement and the position changing movement after an end portion including the end face of the electronic component body is dipped in the dip layer, and extends the distance between the end face of the electronic component body and the flat surface of the surface plate during the distance changing movement.

6. The electronic component manufacturing apparatus according to claim 1, wherein the holding member holds a plurality of electronic component bodies including the electronic component body.

7. The electronic component manufacturing apparatus according to claim 2, wherein the carrier plate holds a plurality of electronic component bodies including the electronic component body.

8. The electronic component manufacturing apparatus according to claim 3, wherein the carrier plate holds a plurality of electronic component bodies including the electronic component body.

9. The electronic component manufacturing apparatus according to claim 4, wherein the carrier plate holds a plurality of electronic component bodies including the electronic component body.

10. The electronic component manufacturing apparatus according to claim 5, wherein the carrier plate holds a plurality of electronic component bodies including the electronic component body.

11. The electronic component manufacturing apparatus according to claim 1, wherein in the position changing movement, a movement locus of the two-dimensional position draws a loop, and the distance changing movement and the position changing movement cause the electronic component body to move spirally with respect to the flat surface of the surface plate.

12. The electronic component manufacturing apparatus according to claim 2, wherein in the position changing movement, a movement locus of the two-dimensional position draws a loop, and the distance changing movement and the position changing movement cause the electronic component body to move spirally with respect to the flat surface of the surface plate.

13. The electronic component manufacturing apparatus according to claim 3, wherein in the position changing movement, a movement locus of the two-dimensional position draws a loop, and the distance changing movement and the position changing movement cause the electronic component body to move spirally with respect to the flat surface of the surface plate.

14. The electronic component manufacturing apparatus according to claim 4, wherein in the position changing movement, a movement locus of the two-dimensional position draws a loop, and the distance changing movement and the position changing movement cause the electronic component body to move spirally with respect to the flat surface of the surface plate.

15. The electronic component manufacturing apparatus according to claim 5, wherein in the position changing movement, a movement locus of the two-dimensional position draws a loop, and the distance changing movement and the position changing movement cause the electronic component body to move spirally with respect to the flat surface of the surface plate.

16. The electronic component manufacturing apparatus according to claim 6, wherein in the position changing movement, a movement locus of the two-dimensional position draws a loop, and the distance changing movement and the position changing movement cause the electronic component body to move spirally with respect to the flat surface of the surface plate.

17. The electronic component manufacturing apparatus according to claim 7, wherein in the position changing movement, a movement locus of the two-dimensional position draws a loop, and the distance changing movement and the position changing movement cause the electronic component body to move spirally with respect to the flat surface of the surface plate.

18. The electronic component manufacturing apparatus according to claim 8, wherein in the position changing movement, a movement locus of the two-dimensional position draws a loop, and the distance changing movement and the position changing movement cause the electronic component body to move spirally with respect to the flat surface of the surface plate.

19. The electronic component manufacturing apparatus according to claim 9, wherein in the position changing movement, a movement locus of the two-dimensional position draws a loop, and the distance changing movement and the position changing movement cause the electronic component body to move spirally with respect to the flat surface of the surface plate.

20. The electronic component manufacturing apparatus according to claim 10, wherein in the position changing movement, a movement locus of the two-dimensional position draws a loop, and the distance changing movement and the position changing movement cause the electronic component body to move spirally with respect to the flat surface of the surface plate.

* * * * *